United States Patent [19]

Levy

[11] Patent Number: 5,126,231
[45] Date of Patent: Jun. 30, 1992

[54] PROCESS FOR MULTI-LAYER PHOTORESIST ETCHING WITH MINIMAL FEATURE UNDERCUT AND UNCHANGING PHOTORESIST LOAD DURING ETCH

[75] Inventor: Karl B. Levy, Los Altos, Calif.

[73] Assignee: Applied Materials, Inc., Santa Clara, Calif.

[21] Appl. No.: 485,331

[22] Filed: Feb. 26, 1990

[51] Int. Cl.$^5$ .................. G03F 7/00; H01L 21/027
[52] U.S. Cl. .................... 430/313; 430/316; 430/317; 430/329; 430/318; 156/643; 156/661.1
[58] Field of Search ............... 430/270, 312, 313, 317, 430/318, 322, 325, 326, 329, 331, 316; 156/643, 651, 652, 659.1, 660, 661.1

[56] References Cited

U.S. PATENT DOCUMENTS

| | | | |
|---|---|---|---|
| 4,244,799 | 1/1981 | Fraser et al. | 204/192.32 |
| 4,683,024 | 7/1987 | Miller et al. | 430/317 |
| 4,738,916 | 4/1988 | Namatsu et al. | 430/312 |

Primary Examiner—Marion E. McCamish
Assistant Examiner—Kathleen Duda
Attorney, Agent, or Firm—John P. Taylor

[57] ABSTRACT

A process is disclosed for accurately forming an etch mask over the uneven surface of a semiconductor wafer using a multilayer photoresist. The process comprises forming a first or lower photoresist layer on the surface of a semiconductor wafer, forming one or more intermediate layers over the first photoresist layer, forming a second or upper photoresist layer over the one or more intermediate layers on the wafer, photolithographically forming a pattern in the second photoresist layer, reproducing the pattern in the intermediate layer below the second photoresist layer, removing the remainder of the upper photoresist layer, and then reproducing the pattern in the first photoresist layer using the pattern formed in the intermediate layer as a mask. In one embodiment a single intermediate layer is used in which the mask pattern is partially etched prior to removal of the upper photoresist. In another embodiment, two intermediate layers are used, with the lower layer used as an etch stop to permit the upper photoresist pattern to be completely etched through the upper intermediate layer before removal of the upper photoresist. The process offers improvement over the prior art by minimizing undercut caused by ion reflection as well as offering an unchanging process loading during the critical photoresist etch.

21 Claims, 6 Drawing Sheets

PROCESS FOR MULTI-LAYER PHOTORESIST ETCHING WITH MINIMAL FEATURE UNDERCUT AND UNCHANGING PHOTORESIST LOAD DURING ETCH

BACKGROUND OF THE INVENTION

1. Field of the Invention

This invention relates to an improved process for forming a mask on an uneven surface of a semiconductor wafer using multilayers of photoresist. More particularly, this invention relates to an improved process for etching a multilayer photoresist mask structure formed on an uneven surface of a semiconductor wafer which will minimize feature undercutting of the lower portions of the mask and also provide even loading of the photoresist during etching.

2. Description of the Related Art

In the preparation of photoresist masks over stepped or uneven surfaces of a semiconductor wafer, it is known that focus (optically-related) problems can occur in the photolithographic transfer of the pattern from the photolithography mask to the photoresist layer when the photoresist layer is not flat. This results in the lack of control of critical dimensions of the features which define the performance of an integrated circuit.

Therefore, when forming a photoresist mask over an uneven surface on a semiconductor wafer in the prior art, e.g., a wafer having already formed thereon integrated circuit structure including raised lines or trenches or the like, it has become the practice to use a multilayer photoresist structure.

Figure 1:
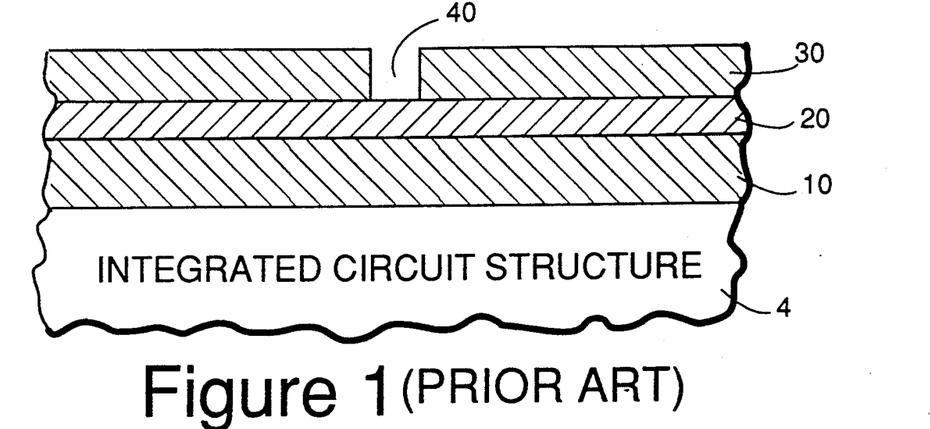
FIGS. 1 is a fragmentary vertical cross-sectional view showing the prior art photolithographic formation of a pattern in the upper photoresist layer of a multilayer photoresist structure.

As shown in the prior art photolithography step of FIG. 1, a planarizing photoresist layer 10 is first formed (spun) over an integrated circuit structure 4 comprising the uneven surface portion of a semiconductor wafer. An intermediate layer 20, which may comprise an oxide such as a spin on glass (SOG) or a CVD formed silicon dioxide glass, is deposited over first photoresist layer 10 and then a second imaging layer of photoresist 30 is formed over oxide layer 20 to provide a level photoresist surface onto which may be projected a light image of the desired pattern from a photolithographic mask, using standard photolithography techniques.

Opening 40 is then photolithographically formed in upper photoresist mask layer 30, as shown in FIG. 1, by optical projection of a light pattern onto photoresist layer 30, followed by development of the photoresist as is well known to those skilled in the art.

While the foregoing practice solves the photolithography problem of attempting to form a light pattern on an uneven surface of a photoresist layer, there still remains the problem of accurately transferring to lower photoresist layer 10 the pattern photolithographically formed in upper photoresist layer 30.

Figure 2:
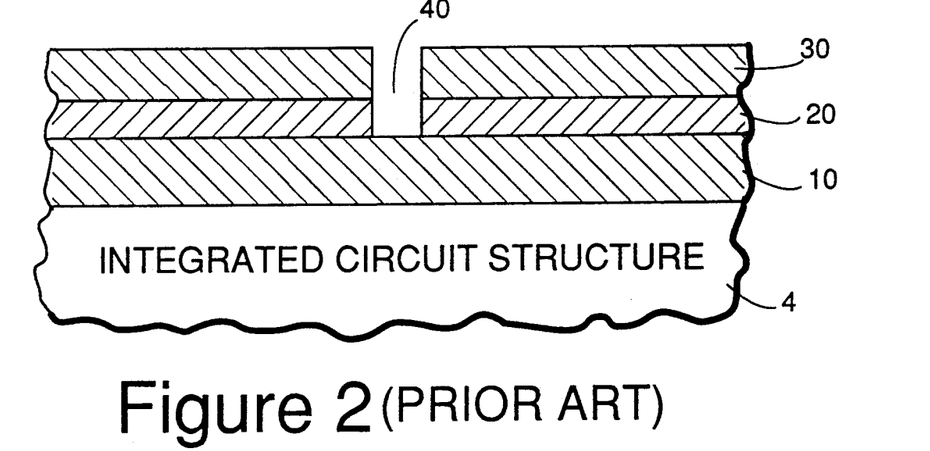
FIGS. 2-4 are fragmentary vertical cross-sectional views sequentially illustrating the prior art practice of reproducing, in a lower photoresist layer, a pattern photolithographically formed in an upper photoresist layer.
Figure 3:
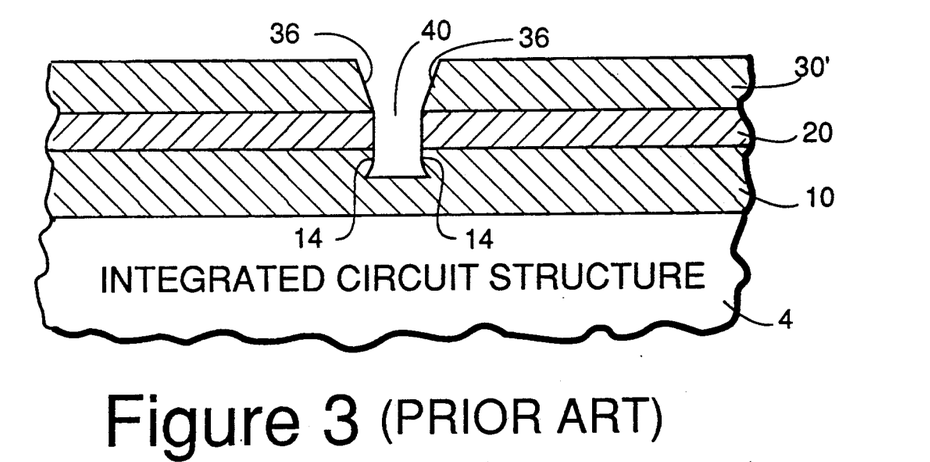
Figure 4:
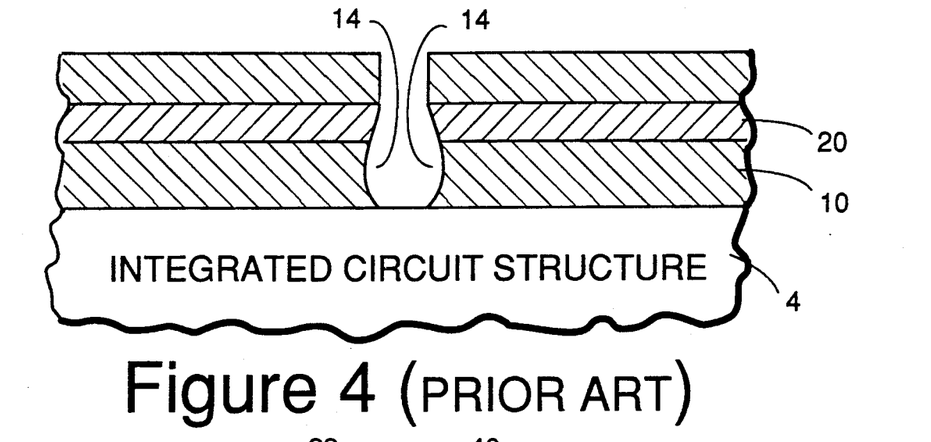

FIGS. 2-4 sequentially illustrate the prior art practice of forming in lower photoresist layer 10 the pattern photolithographically formed in upper photoresist layer 30.

As shown in FIG. 2, the initial step in the prior art, following the photolithography step, was to anisotropically etch the oxide layer 20 in between the upper and lower photoresist layers through opening 40 formed in upper photoresist layer 30, using an appropriate oxide etch chemistry, thereby exposing that portion of the surface of underlying lower photoresist layer 10 through opening 40.

The etch chemistry was then changed to a photoresist etch chemistry to anisotropically etch an opening through lower photoresist mask layer 10, using opening 40 formed in upper photoresist mask layer 30 and oxide layer 20 as a mask, as shown in FIGS. 3 and 4.

However, as seen in FIGS. 3 and 4, two problems were encountered in the prior art with this process. First of all, when the etch chemistry is changed to etch photoresist, the exposed portion of lower photoresist layer 10 is etched through opening 40 simultaneous with the blanket etching of the entire surface of upper photoresist layer 30. However, when upper photoresist layer 30 has been completely removed, the etch loading on the system drastically changes, since only the relatively small surface area of photoresist layer 10 exposed by opening 40 (as well as other similar openings in oxide layer 20) is now being etched. This results in problems of control of the etch rate.

Additional problems which were encountered in the prior art using the above procedures included detection of the process end (by emission spectroscopy) due to the increase in etch/rate and the signal intensity change when layers 30 clears. Also, the change in gas phase composition, when changing the etch chemistry during the process, affects the process results, e.g., the feature profile of the resulting integrated circuit structure.

Furthermore, it will also be noted in FIG. 3 that during the anisotropic blanket etching of upper photoresist layer 30, faceting of the edge of photoresist layer 30 occurs at the corners of opening 40, as shown at 36. This, in turn, results in deflection or reflection of the etch ions from these surfaces to strike the sidewalls of lower photoresist layer 10 at 14, during the anisotropic photoresist etch step, causing a bowing effect in the sidewalls of the opening 40 being etched in lower photoresist layer 10. When this occurs, a true image of the pattern photolithographically formed in upper photoresist layer 30 will not be reproduced precisely in lower photoresist layer 10, thus defeating the whole purpose of using a multi-layer photoresist mask.

SUMMARY OF THE INVENTION

It is, therefore, an object of this invention to provide a process for forming an etch mask over the uneven surface of a semiconductor wafer using a multilayer photoresist wherein a mask pattern photolithographically formed in the upper photoresist layer may be accurately reproduced in the lower photoresist layer.

It is another object of this invention to provide a process for forming an etch mask over the uneven surface of a semiconductor wafer using a multilayer photoresist having at least one layer of a different material in between the photoresist layers wherein a mask pattern photolithographically formed in the upper photoresist layer may be accurately reproduced in the lower photoresist layer by completely removing the upper layer of photoresist before anisotropically etching the lower layer of photoresist.

It is still another object of this invention to provide a process for forming an etch mask over the uneven surface of a semiconductor wafer using a multilayer photoresist having at least one layer of a different material in between the photoresist layers wherein a mask pattern photolithographically formed in the upper photoresist layer may be accurately reproduced in the lower photoresist layer by reproducing, in the layer of different material, the mask pattern photolithographically formed in the upper layer of photoresist, and then completely removing the upper layer of photoresist before anisotropically etching the lower layer of photoresist.

It is yet another object of this invention to provide a process for forming an etch mask over the uneven surface of a semiconductor wafer using a multilayer photoresist having at least one layer of a different material in between the photoresist layers wherein a mask pattern photolithographically formed in the upper photoresist layer may be accurately reproduced in the lower photoresist layer by reproducing, in the layer of different material, the mask pattern photolithographically formed in the upper layer of photoresist, by partially etching anisotropically the layer of different material and then completely removing the upper layer of photoresist before anisotropically etching through the remainder of the layer of different material and before anisotropically etching the lower layer of photoresist.

It is a further object of this invention to provide a process for forming an etch mask over the uneven surface of a semiconductor wafer using a multilayer photoresist having at least two layers of different materials in between the photoresist layers wherein a mask pattern photolithographically formed in the upper photoresist layer may be accurately reproduced in the lower photoresist layer by reproducing, in the upper layer of different material, the mask pattern photolithographically formed in the upper layer of photoresist, by anisotropically etching through the upper layer of different material, using the lower layer of different material as an etch stop, and then completely removing the upper layer of photoresist before etching through the lower layer of different material and before anisotropically etching the lower layer of photoresist.

These and other objects of the invention will be apparent from the following description and accompanying drawings.

DETAILED DESCRIPTION OF THE INVENTION

The invention provides a process for accurately reproducing, in a lower photoresist mask, a pattern photolithographically formed in the upper photoresist layer of a multilayer photoresist having at least one layer of a different material formed in between the two photoresist layers, to form a mask which permits the accurate formation of a patterned layer on an uneven surface of a semiconductor wafer.

While the invention may find greatest utility at the present time in the construction of integrated circuit structures on silicon wafers, it should be noted that the invention may also be used in connection with other semiconductor wafers as well, including, but not limited to Group III-V type semiconductors such as, for example, gallium arsenide or indium arsenide wafers.

Turning now to FIGS. 5-8, the sequential steps of the first embodiment of the process are illustrated. In this embodiment, the prior art structure shown in FIG. 1 serves as the starting point for the process of the invention. As previously described above, first photoresist layer 10, which may have a thickness ranging from about 1 micron to about 3 microns, is formed over the uneven surface of a semiconductor wafer which may have an integrated circuit structure previously formed in and on the surface of the wafer, resulting in the uneven or stepped surface.

A layer 20 of a different material such as an oxide of silicon, e.g., $SiO_2$, is formed over layer 10 and a second planarizing layer 30 of photoresist is formed over layer 20, and then photolithographically patterned to form openings such as opening 40.

While the structure and processing described so far constitutes the prior art, it should, nevertheless, be mentioned at this point that layer 20, which will be utilized in the practice of the process of the present invention, need not constitute oxide, but may instead, comprise any materials which may be etched independent of either of the photoresist layers as will be apparent below. Thus layer 20 could comprise a metal layer such as aluminum, a polysilicon layer, or a silicon nitride layer, etc. Other materials which could be used in intermediate layer 20 include refractory materials including tungsten, tungsten silicide, titanium, titanium silicide, titanium nitride, and titanium-tungsten; as well as compounds which include one or more group III or Group V elements such as gallium, indium, antimony, arsenic, boron, and phosphorus. The thickness of intermediate layer 20 may range from about 750-1500 Angstroms, and typically will be about 1000 Angstroms.

At this point, in the prior art, the intermediate layer 20, which served as a stop for the photolithographic processing of upper layer 30, would have been completely etched through, using an anisotropic etch system with selectivity of the intermediate layer to the photoresist, using the pattern in upper photoresist mask layer 30, e.g., opening 40, as the mask for etching layer 20.

Figure 5:
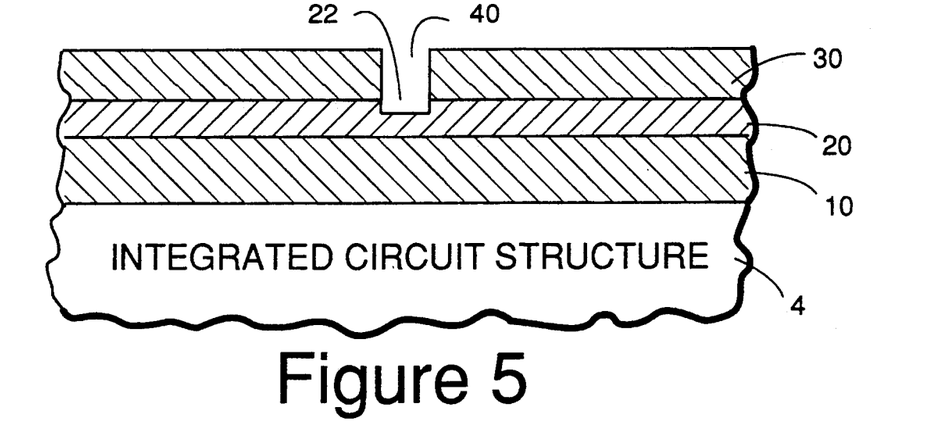
FIGS. 5-8 are fragmentary vertical cross-sectional views sequentially illustrating one embodiment of the process of the invention for accurately reproducing, in a lower photoresist layer, a pattern photolithographically formed in an upper photoresist layer.

However, instead, in accordance with this embodiment of the process of the invention, intermediate layer 20, which will hereinafter be referred to as an oxide layer for purposes of illustration and not of limitation, is only partially etched through, as shown at 22 in FIG. 5, using the mask pattern formed in upper photoresist layer 10 as the etch mask for an anisotropic etch such as a dry etch using a plasma.

When intermediate layer 20 is an oxide layer the anisotropic dry etch will preferably be carried out using a chemistry containing fluorocarbons such as, for example, $CF_4$, $CHF_3$, or $C_2F_6$ flowing into an etching chamber such as, for example, a single wafer etching chamber, at a rate within a range of from about 5 standard cubic centimeters/minute (sccm) to about 200 sccm and using a plasma at a power within a range of from about 50 Watts to about 500 Watts, and pressure from about 10 milliTorr to about 4 Torr. It will be understood, of course, that the above flow rates would have to be appropriately scaled upward for multiple wafer etching chambers. watts.

When intermediate layer 20 constitutes another material, the etch chemistry will be changed accordingly. For example, when layer 20 comprises silicon nitride, the etch chemistry may also comprise $CF_4$, $CHF_3$, or $C_2F_6$; but when layer 20 comprises a metal layer such as aluminum, the etch chemistry may comprise, for example, $BCl_3$, $HCl$, $Cl_2$, $SiCl_4$, or $CCl_4$; and when layer 20 comprises polysilicon, the etch chemistry may comprise, for example, $BCl_3$, $Cl_2$, $HCl$, $CCl_4$, $Br_2$, or $HBr$.

The flow rates, power levels, and pressure range will also vary, depending upon the type of material which constitutes layer 20. For example, when layer 20 comprises a silicon nitride ($Si_3N_4$) layer, the flow rate of the etch chemistry may range from about 5 sccm to about 200 sccm, the plasma power level from about 50 to about 500 Watts, and the pressure from about 10 milliTorr to about 4 Torr (i.e., conditions similar to etching of an oxide layer; but when layer 20 comprises aluminum, the flow rate may range from about 5 sccm to about 100 sccm, the plasma power level from about 50 to about 300 Watts, and the pressure from about 1 milliTorr to about 1 Torr; and when layer 20 comprises polysilicon, the flow rate may range from about 5 sccm to about 100 sccm, the plasma power level from about 50 to about 300 Watts, and the pressure from about 1 milliTorr to about 1 Torr.

The extent of the depth of the initial anisotropic etching of oxide layer 20, will vary from at least about 60% up to about 90%, i.e., leaving from about 10% to about 40% of the oxide layer remaining. Preferably the amount of oxide removed through opening 40 in upper photoresist layer 30 will range from about 70% to about 80%, i.e., leaving from about 20% to about 30% of the oxide thickness remaining.

The minimum amount of at least about 60% is selected to ensure leaving an adequate thickness of oxide mask layer 20 over bottom photoresist layer 10 during a subsequent blanket etch step used to remove the remainder of the oxide exposed through opening 40, as will be described below. The maximum amount of oxide removed in this first step is selected to ensure that a sufficient amount of oxide will be left in opening 40 over underlying photoresist layer 10 as a protective layer so that bottom photoresist layer 10 will not be etched during the subsequent step of removing the remainder of upper photoresist layer 30.

Figure 6:
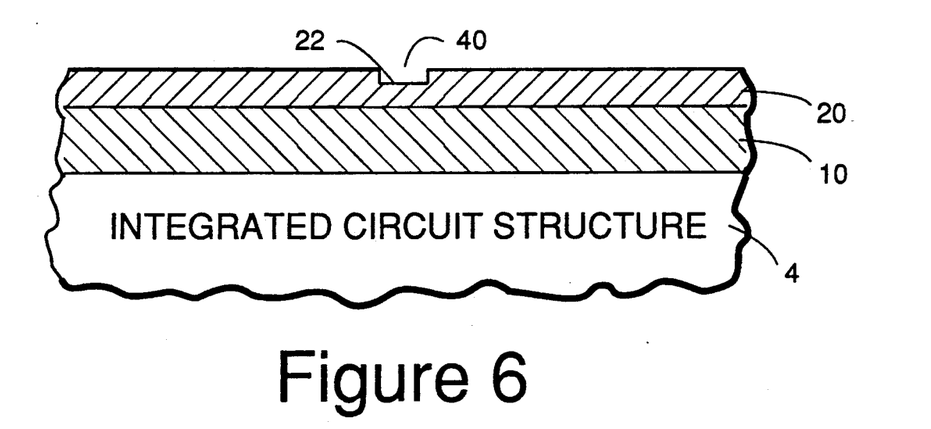

After the partial anisotropic etching of oxide layer 30 through upper photoresist mask layer 30, the etch chemistry may be changed to completely remove upper photoresist layer 40, as shown in FIG. 6, using, for example, $O_2$, $CO$, or $N_2O$, at a flow rate of from about 50 to about 500 sccm at a pressure ranging from about 100 milliTorr to about 4 Torr and a plasma at a power level of from about 50 Watts to about 500 Watts to remove the remainder of upper photoresist layer 30. It should be noted that this particular step need not be an anisotropic etch, but conveniently will also be carried out as a dry etch in view of the location of the semiconductor wafer for other etch steps of the process which must be carried out under anisotropic etch conditions.

After the removal of upper photoresist layer 30, the remaining oxide (or alternate intermediate material) in opening 40 is removed by a blanket oxide etch, again using appropriate etch chemistry, depending upon the material comprising layer 20, as previously described, e.g., such as a fluorocarbon as an etchant for an oxide layer.

Figure 7:
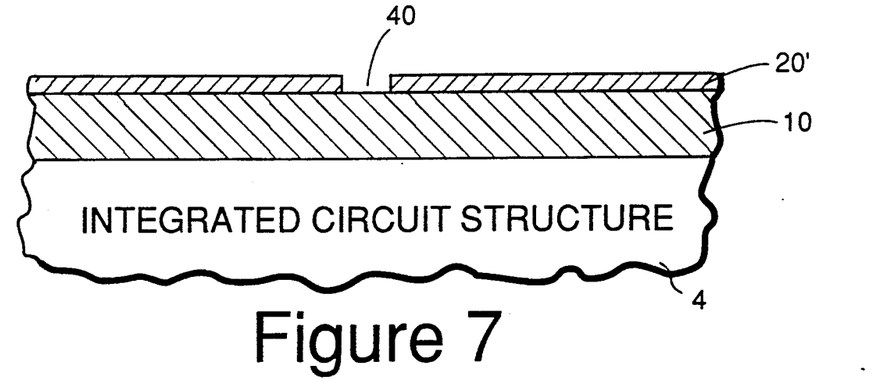

This blanket etch also results in the thinning of the remainder of layer 20, as shown in FIG. 7, in which the thinned layer 20 is now designated as 20'. However, if the depth of the initial partial etch of opening 40 in layer 20 was deep enough, as previously discussed, removal of the remaining oxide in opening 40 should not result in the removal of an excessive amount of the remainder of oxide layer 20'.

Figure 8:
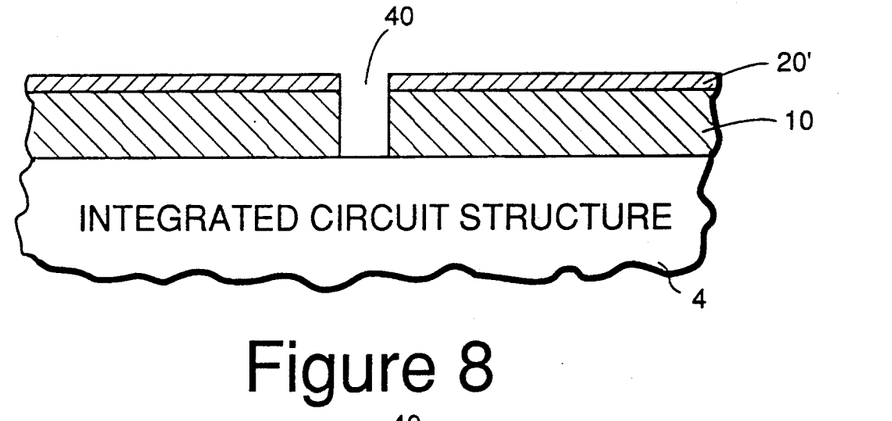

With the removal of the remainder of intermediate layer 20 from opening 40, lower photoresist layer 10 may now be etched, utilizing an oxygen-containing chemistry, such as, for example, $O_2$, $CO$, or $N_2O$, and conditions optimal for anisotropic etching, i.e., a flow rate of from about 5 sccm to about 50 sccm, a power level of from about 50 Watts to about 300 Watts, and a pressure of from about 0.1 milliTorr to about 100 milliTorr, using oxide layer 20' as an etch mask, resulting in the structure shown in FIG. 8.

At this point the remainder of oxide layer 20' may be removed, if necessary or desired, using, for example, an oxide etch, and the patterned lower photoresist mask may be utilized in further conventional processing. It should be noted, however, that it may not be necessary to remove layer 20' since the material to be etched beneath lower photoresist layer 10 may constitute the same material as layer 20', e.g., an oxide layer. Furthermore, subsequent removal of lower photoresist layer 10, after completion of an etch of the layer below photoresist layer 10, will result in removal of any portions of layer 20' thereon.

It will be noted that since photoresist layer 10 is etched only through layer 20', and not through upper photoresist layer 30 as well, as in the prior art process shown in FIGS. 2-4, the walls of the opening etched in lower photoresist layer 10 are straight, unlike the bowed walls of FIG. 4.

Furthermore, not only has the problem of the faceted corners in the upper photoresist layer (shown in prior art FIG. 3) been minimized by the process of the invention, but the prior art problem of change in photoresist load during etching has also been eliminated since the upper and lower photoresist layers are never etched simultaneously as in the prior art process.

Figure 9:
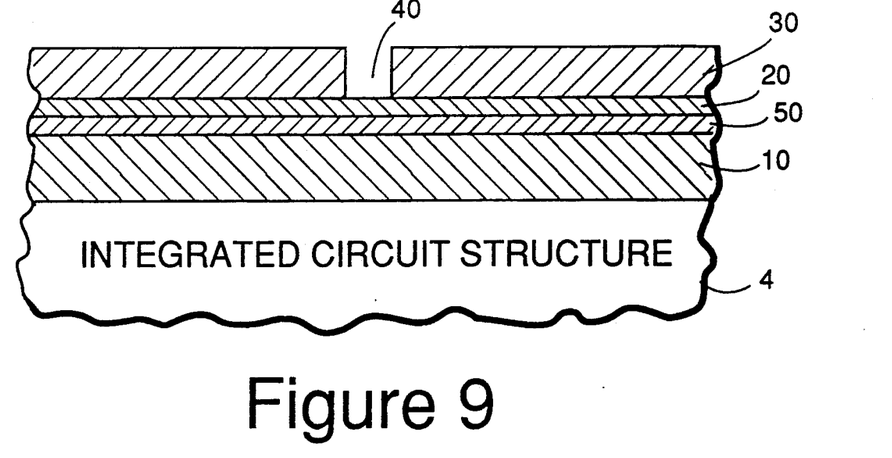
FIGS. 9-13 are fragmentary vertical cross-sectional views sequentially illustrating another embodiment of the process of the invention for accurately reproducing, in a lower photoresist layer, a pattern photolithographically formed in an upper photoresist layer.

Turning now to FIGS. 9-13, another embodiment of the invention is shown which employs an additional intermediate layer 50 between intermediate layer 20 and lower photoresist layer 10, as shown in FIG. 9 wherein the opening 40 is already shown as photolithographically formed in upper photoresist layer 30, as in the previous embodiment. The purpose of this additional intermediate layer is to provide an etch stop when opening 40 is being etched in intermediate layer 20. The use of such a second intermediate layer as an etch block eliminates the need to partially etch opening 40 in intermediate layer 20 and thus eliminates the need to carefully control the extent of the depth of the partial etch, as described in the previous embodiment.

Figure 10:
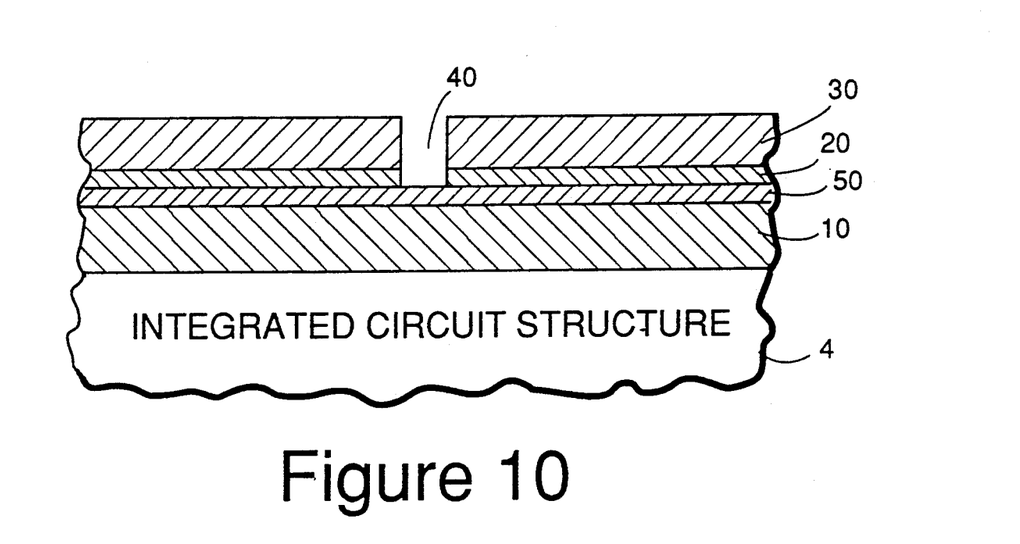

Instead, as shown in FIG. 10, in this embodiment of the process, opening 40 may be anisotropically etched through the entire thickness of intermediate layer 20, using intermediate layer 50 as the etch stop for the etch system used to etch layer 20.

In view of this function of layer 50, it is important that layer 50 comprise a material different from either the photoresist material used in layers 10 and 30 as well as different from the material used for intermediate layer 20. In the illustrated embodiment, second intermediate layer 50 will be referred to as an aluminum layer by way of illustration and not of limitation. However, it will be understood that any of the materials previously discussed as suitable for layer 20 may be utilized for layer 50 as long as layers 20 and 50 constitute different materials from that group. The thickness of second intermediate layer 50 may range from about 750–1500 Angstroms, and typically will be about 1000 Angstroms.

Figure 11:
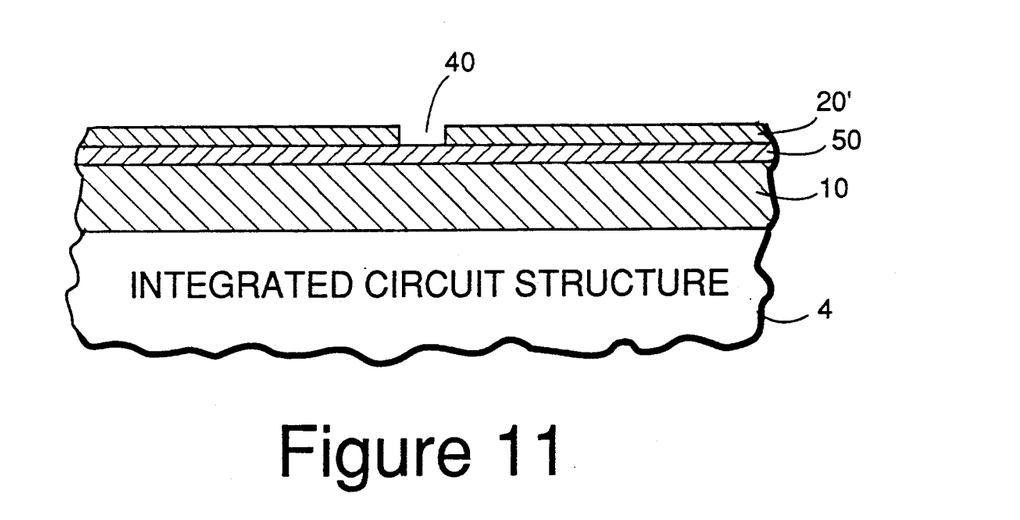

After opening 40 has been anisotropically etched in oxide layer 20, upper photoresist layer 30 may be removed in the manner previously described resulting in the structure shown in FIG. 11.

Figure 12:
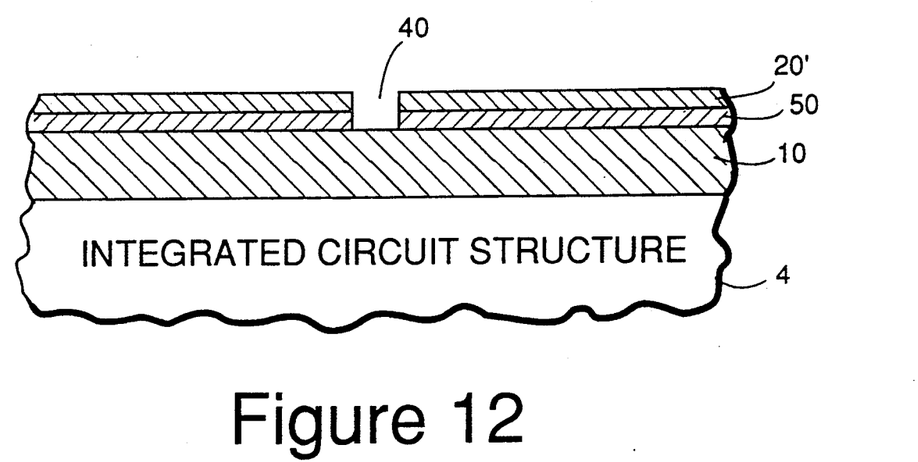

Opening 40 is then etched through aluminum layer 50, as shown in FIG. 12, using the previously formed opening 40 in oxide layer 20 as the etch mask for aluminum layer 50. Aluminum layer 50 may be either dry etched or wet etched. A chlorinated chemistry, such as $BCl_3$, $Cl_2$, HCl, $SiCl_4$, or $CCl_4$, may be used for a plasma-assisted anisotropic dry etch, while an acid such as phosphoric acid, acetic acid, or nitric acid may be used for a wet etch. As in the previously described embodiment, the use of a dry etch will probably be preferred since the wafer will already be loaded into a dry etching apparatus to perform the mandatory anisotropic etching steps.

Figure 13:
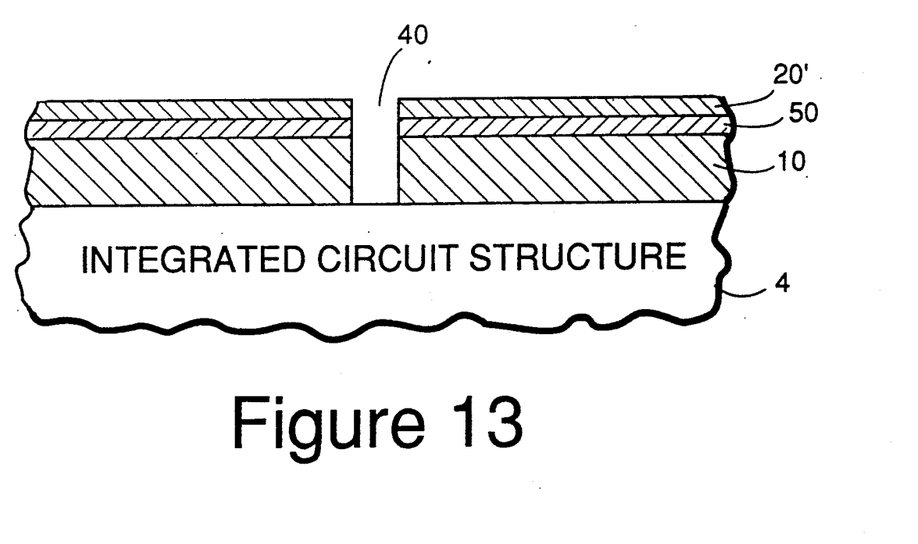
Figure 14:
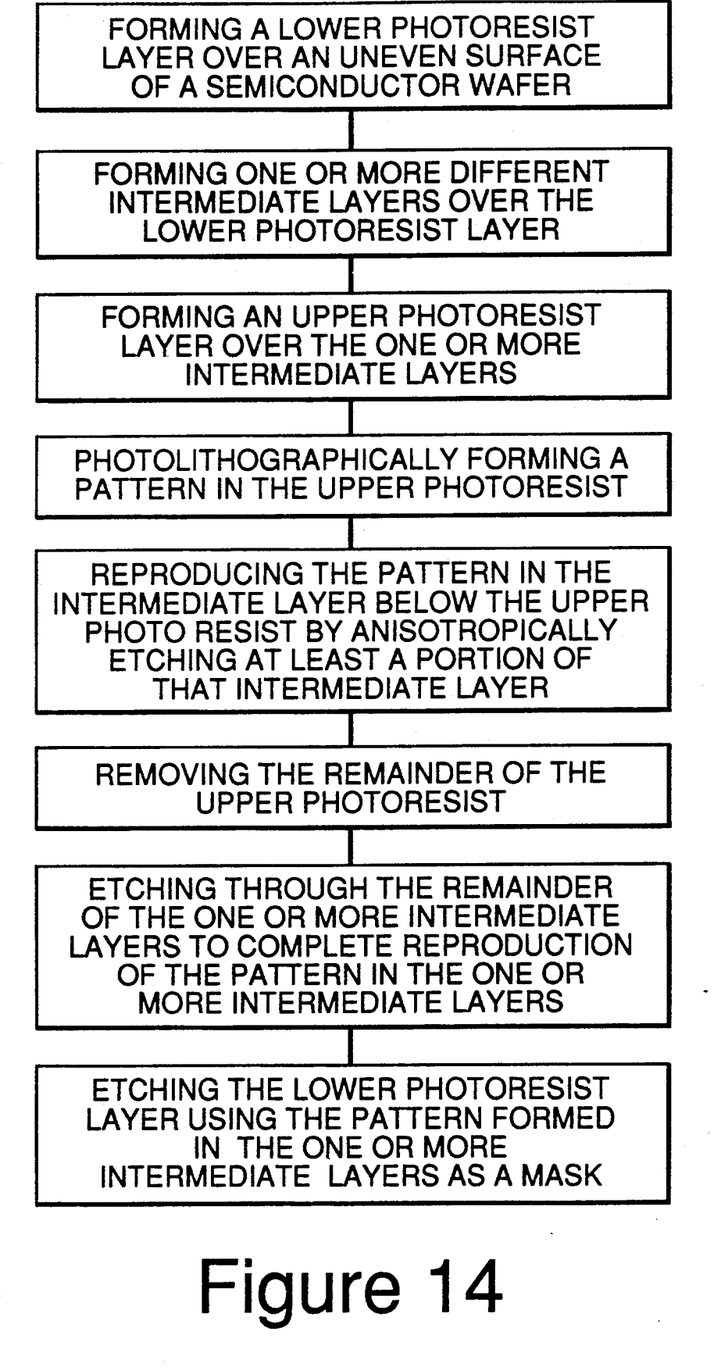
FIG. 14 is a flowsheet illustrating the process of the invention.

After forming opening 40 in lower intermediate layer 50, opening 40 may be anisotropically etched in lower photoresist layer 10, using the oxide and aluminum intermediate layers as etch masks resulting in the structure shown in FIG. 13. As in the previous embodiment, the intermediate layers may then be conventionally removed, if desired, and the lower photoresist mask used in further conventional processing.

The following examples will serve to further illustrate the process of the invention.

EXAMPLE I

A semiconductor wafer having integrated circuit structure already formed thereon, resulting in an uneven surface, was coated with a first layer of a photoresist which was spun on to an average thickness of about 2 microns. A silicon dioxide ($SiO_2$) layer having an average thickness of about 1000 Angstroms was deposited over the photoresist layer and then a second photoresist layer, having an average thickness of about 1 micron, was spun on over the oxide layer, resulting in a substantially planarized surface on the wafer.

A pattern was then photolithographically formed in the upper photoresist by exposing the photoresist to a light pattern through a photolithography mask and then developing the exposed photoresist layer.

The structure was then anisotropically etched while flowing 30 sccm of $CF_4$ into the etch chamber at a pressure of about 50 milliTorr, and maintaining a plasma power of about 200 Watts, to etch the underlying oxide layer. The etch was continued until about 70% of the oxide layer had been etched through the photolithographically formed openings in the upper photoresist layer. The etch chemistry was then changed to flow 200 sccm of $O_2$ into the etch chamber at a pressure throttled to 500 milliTorr, while maintaining the same plasma power, to remove all of the upper layer of photoresist.

After removal of all of the upper layer of photoresist, the oxide etch was resumed until the lower photoresist layer was exposed through the openings formed in the oxide layer. The etch chemistry was then again changed by again flowing $O_2$ into the etch chamber, at a flow rate of about 20 sccm and at a pressure of about 5 milliTorr, using a power level of about 100 Watts, to etch openings through the lower photoresist layer using the patterned oxide layer as a mask. The remainder of the oxide layer was then removed with an HF wet etch to permit examination of the quality of the resulting openings in the lower photoresist mask and comparison with the original photolithography mask used to pattern the upper photoresist layer. The pattern of the original photolithography mask was found to have been accurately reproduced in the lower photoresist layer with no evidence of bowing or unevenness of the sidewalls of the openings in the resulting photoresist mask.

EXAMPLE II

To illustrate the second embodiment of the invention, another semiconductor wafer, also having integrated circuit structure already formed thereon, resulting in an uneven surface, was also coated with a first layer of a photoresist which was spun on to an average thickness of about 2 microns. A first intermediate layer of aluminum, having an average thickness of about 1000 Angstroms was then formed over the photoresist layer. A silicon dioxide ($SiO_2$) layer having an average thickness of about 1000 Angstroms was deposited over the aluminum layer. A second photoresist layer, having an average thickness of about micron, was then spun on over the oxide layer, resulting in a substantially planarized surface on the wafer.

As in Example I, a pattern was then photolithographically formed in the upper photoresist layer by exposing the layer to a light pattern through a photolithography mask and then developing the exposed photoresist layer.

The structure was then anisotropically etched while flowing 30 sccm of $CF_4$ into the etch chamber at a pressure of about 50 milliTorr and maintaining a plasma power of about 200 Watts to etch openings through the underlying oxide layer, using the formed openings in the upper photoresist layer as a mask, and using the underlying aluminum layer as an etch stop. The etch chemistry was then changed to flow 200 sccm of $O_2$ into the etch chamber at about 500 milliTorr, while maintaining the same plasma power, to remove all of the upper layer of photoresist.

After removal of all of the upper layer of photoresist, the etch chemistry was changed to flow 10 sccm of $BCl_3$ and 25 sccm of $Cl_2$ at a pressure of about 100 milliTorr and a power level of about 100 Watts, to etch the portions of the aluminum layer exposed through the openings formed in the oxide layer. When the aluminum was etched through, exposing the lower photoresist layer, the etch chemistry was again changed by again flowing $O_2$ into the etch chamber to etch openings through the lower photoresist layer using the patterned oxide and aluminum layers as the mask.

The remainder of the oxide layer was then removed with an HF wet etch (again for examination purposes) and the underlying aluminum mask was also removed. The resulting openings in this lower photoresist mask were then examined and also compared with the original photolithography mask. The pattern of the original photolithography mask was again found to have been accurately reproduced in the lower photoresist layer with no evidence of bowing or unevenness of the sidewalls of the openings in the resulting photoresist mask.

Thus, in either embodiment of the process of the invention, the initial openings photolithographically formed in upper photoresist layer 30 may be accurately reproduced in lower photoresist layer 10 resulting in the accurate and precise patterning of the uneven surface of a semiconductor wafer having integrated circuit structure such as raised lines, etc., already formed thereon. The process of the invention eliminates the problem of faceting of the corners of the mask opening formed in the upper photoresist layer, thereby eliminating the formation of bowed sidewalls in the opening formed in the lower photoresist layer. The process of the invention also eliminates the problem of changes in the photoresist load during the etching of the opening in the lower photoresist layer since both photoresist layers are never simultaneously etched.

Having thus described the invention, what is claimed is:

1. A process for forming an etch mask over the surface of a semiconductor wafer using a multilayer photoresist wherein a mask pattern photolithographically formed in the upper photoresist layer of said multilayer photoresist may be accurately reproduced in the lower photoresist layer of said multilayer photoresist which comprises:
   a) forming a photoresist layer on the surface of a semiconductor wafer which will be the lower photoresist layer of said multilayer photoresist;
   b) forming one or more intermediate layers over said lower photoresist layer;
   c) forming an upper photoresist layer over said one or more intermediate layers on said wafer;
   d) photolithographically forming a pattern in said upper photoresist layer;
   e) reproducing said pattern in a portion of said one or more intermediate layers below and in contact with said upper photoresist layer;
   f) removing the remainder of said upper photoresist layer;
   g) then reproducing said pattern in a portion of said one or more intermediate layers in contact with said lower photoresist layer using said previously etched portion of said one or more intermediate layers as a mask; and
   h) then reproducing said pattern in said lower photoresist layer using said pattern formed in said one or more intermediate layers as a mask;
whereby a mask pattern photolithographically formed in said upper photoresist layer may be accurately reproduced in said lower photoresist layer while removing said upper photoresist layer before said pattern is reproduced in said lower photoresist layer.

2. The process of claim 1 wherein said step of reproducing said pattern in a portion of said one or more said intermediate layers below and in contact with said upper photoresist layer further comprises anisotropically etching said portion of said one or more intermediate layers.

3. The process of claim 2 wherein a single intermediate layer is used and said step of reproducing said pattern in said portion of said one or more intermediate layers below and in contact with said upper photoresist layer further comprises the steps of anisotropically etching said pattern partially through from about 60 to about 90% of the thickness of said single intermediate layer before said step of removing the remainder of said upper photoresist layer; and then anisotropically etching through the remainder of said partially etched portion of said single intermediate layer after said step of removing said upper layer of photoresist.

4. The process of claim 3 wherein said step of reproducing said pattern in said intermediate layer below said upper photoresist layer by anisotropically etching partially through said single intermediate layer further comprises anisotropically etching through from about 70 to about 80% of the thickness of said single intermediate layer.

5. The process of claim 3 wherein said single intermediate layer is selected from the group consisting of silicon dioxide, silicon nitride, polysilicon, and aluminum.

6. The process of claim 5 wherein said single intermediate layer comprises silicon dioxide.

7. The process of claim 1 including the further step of removing said one or more intermediate layers after reproducing said pattern in said first photoresist layer.

8. The process of claim 1 wherein said step of forming one or more intermediate layers over said lower photoresist layer further comprises forming upper and lower intermediate layers of different materials over said lower photoresist layer; and said step of reproducing said pattern in a portion of said one or more intermediate layers below and in contact with said upper photoresist layer further comprises anisotropically etching said upper intermediate layer using said lower intermediate layer as an etch stop.

9. The process of claim 8 including the further step of etching said lower intermediate layer, after said step of removing the remainder of said upper photoresist layer, using said pattern etched in said upper intermediate layer as an etch mask.

10. The process of claim 9 wherein said upper intermediate layer is selected from the group consisting of silicon dioxide, silicon nitride, polysilicon, aluminum, tungsten, tungsten silicide, titanium, titanium silicide, titanium nitride, titanium-tungsten, a gallium compound, an indium compound, an antimony compound, an arsenic compound, a boron compound, and a phosphorus compound; and said lower intermediate layer comprises another material in said group.

11. The process of claim 10 wherein one of said upper and lower intermediate layers comprises silicon dioxide and the other of said upper and lower intermediate layers comprises aluminum.

12. A process for forming an etch mask over the uneven surface of a semiconductor wafer using a multilayer photoresist to accurately reproduce in the lower photoresist layer a pattern photolithographically formed in the upper photoresist layer comprising the steps of:
   a) forming a lower photoresist layer on said surface of said semiconductor wafer;
   b) forming an intermediate layer of a different material over said lower photoresist layer;
   c) forming an upper photoresist layer over said intermediate layer on said wafer;
   d) photolithographically forming a pattern in said upper photoresist layer;
   e) reproducing said pattern in said intermediate layer by anisotropically etching a portion of said intermediate layer using said patterned upper photoresist layer as an etch mask;
   f) removing the remainder of said upper photoresist layer;

g) blanket etching said intermediate layer sufficiently to expose the lower layer of photoresist through said pattern of openings in said intermediate layer; and h) reproducing said pattern in said lower photoresist layer using said pattern formed in said intermediate layer as a mask;

whereby a mask pattern photolithographically formed in said upper photoresist layer may be accurately reproduced in said lower photoresist layer after removal of said upper photoresist layer.

13. The process of claim 12 wherein said step of anisotropically etching a portion of said intermediate layer using said patterned upper photoresist layer as an etch mask further comprises anisotropically etching through from about 60 to about 90% of the thickness of said intermediate layer.

14. The process of claim 12 wherein said step of anisotropically etching a portion of said intermediate layer using said patterned upper photoresist layer as an etch mask further comprises anisotropically etching through from about 70 to about 80% of the thickness of said intermediate layer.

15. The process of claim 12 wherein said intermediate layer is selected from the class consisting of silicon dioxide, silicon nitride, polysilicon, and aluminum.

16. The process of claim 12 wherein said intermediate layer comprises a refractory material selected from the class consisting of tungsten, tungsten silicide, titanium, titanium silicide, titanium nitride, and titanium-tungsten.

17. The process of claim 12 wherein said intermediate layer comprises a Group III or Group V compound selected from the class consisting of a gallium compound, an indium compound, an antimony compound, an arsenic compound, a boron compound, and a phosphorus compound.

18. The process of claim 12 wherein said intermediate layer comprises silicon dioxide.

19. A process for forming an etch mask over the uneven surface of a semiconductor wafer using a multilayer photoresist to accurately reproduce in the lower photoresist layer a pattern photolithographically formed in the upper photoresist layer comprising the steps of:

a) forming a lower photoresist layer on said surface of said semiconductor wafer;

b) forming a lower intermediate layer of a different material over said lower photoresist layer;

c) forming an upper intermediate layer of a different material than either said lower intermediate layer or said lower photoresist layer over said lower intermediate layer;

d) forming an upper photoresist layer over said upper intermediate layer on said wafer;

e) photolithographically forming a pattern in said upper photoresist layer;

f) reproducing said pattern in said upper intermediate layer by anisotropically etching said upper intermediate layer using said patterned upper photoresist layer as an etch mask and said lower intermediate layer as an etch stop;

g) removing the remainder of said upper photoresist layer;

h) etching the exposed portions of said lower intermediate layer, using said patterned upper intermediate layer as a mask, to expose portions of said lower layer of photoresist through said pattern of openings etched in said upper and lower intermediate layers; and i) reproducing said pattern in said first photoresist layer using said pattern formed in said upper and lower intermediate layers as a mask;

whereby a mask pattern photolithographically formed in said upper photoresist layer may be accurately reproduced in said lower photoresist layer after said upper photoresist layer has been removed.

20. The process of claim 19 wherein said lower intermediate layer is selected from the group consisting of silicon dioxide, silicon nitride, polysilicon, aluminum, tungsten, tungsten silicide, titanium, titanium silicide, titanium nitride, titanium-tungsten, a gallium compound, an indium compound, an antimony compound, an arsenic compound, a boron compound, and a phosphorus compound; and said upper intermediate layer comprises an other material in said group.

21. The process of claim 19 wherein one of said intermediate layers comprises aluminum and the other of said intermediate layers comprises silicon dioxide.

* * * * *